US006800495B2

(12) United States Patent
Payan et al.

(10) Patent No.: US 6,800,495 B2
(45) Date of Patent: Oct. 5, 2004

(54) LOT-OPTIMIZED WAFER LEVEL BURN-IN

(75) Inventors: Cesar Payan, San Jose, CA (US); Bo Jin, Campbell, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 17 days.

(21) Appl. No.: 10/251,091

(22) Filed: Sep. 20, 2002

(65) Prior Publication Data

US 2004/0058461 A1 Mar. 25, 2004

(51) Int. Cl.[7] .............................................. H01L 21/66
(52) U.S. Cl. ......................... 438/14; 438/660; 438/690; 257/48
(58) Field of Search .......................... 438/14, 660, 690; 257/48

(56) References Cited

U.S. PATENT DOCUMENTS

| | | | |
|---|---|---|---|
| 5,600,257 A | | 2/1997 | Leas et al. |
| 5,739,050 A | * | 4/1998 | Farnworth ................... 438/15 |
| 5,831,445 A | | 11/1998 | Atkins et al. |
| 5,896,038 A | | 4/1999 | Budnaitis et al. |
| 5,966,022 A | | 10/1999 | Budnaitis et al. |
| 5,976,899 A | * | 11/1999 | Farnworth et al. ............ 438/14 |
| 6,026,038 A | | 2/2000 | Cho et al. |
| 6,032,356 A | | 3/2000 | Eldridge et al. |
| 6,077,719 A | * | 6/2000 | Koike .......................... 438/17 |
| 6,121,065 A | | 9/2000 | Wong et al. |
| 6,122,760 A | * | 9/2000 | Grosch et al. ............... 714/724 |
| 6,233,185 B1 | | 5/2001 | Beffa et al. |
| 6,243,308 B1 | | 6/2001 | Lin |
| 6,255,208 B1 | | 7/2001 | Bernier et al. |
| 6,255,727 B1 | * | 7/2001 | Khoury ....................... 257/693 |
| 6,261,854 B1 | * | 7/2001 | Akram et al. ................. 438/17 |
| 6,297,155 B1 | * | 10/2001 | Simpson et al. ............. 438/687 |
| 6,337,576 B1 | | 1/2002 | Wiggin et al. |
| 6,352,868 B1 | * | 3/2002 | Yang ............................ 438/14 |
| 6,362,013 B1 | * | 3/2002 | Yoshimura .................... 438/14 |
| 6,384,613 B1 | | 5/2002 | Cheng et al. |
| 6,388,460 B1 | | 5/2002 | Fang et al. |
| 6,411,116 B1 | * | 6/2002 | DeHaven et al. ............ 324/765 |
| 6,548,826 B2 | * | 4/2003 | Fenner et al. ................ 257/48 |
| 6,577,148 B1 | * | 6/2003 | DeHaven et al. ............ 324/765 |

\* cited by examiner

*Primary Examiner*—John F. Niebling
*Assistant Examiner*—Olivia T. Luk
(74) *Attorney, Agent, or Firm*—Okamoto & Benedicto LLP

(57) ABSTRACT

Embodiments disclosed relate to wafer level burn-in of integrated circuits on a semiconductor wafer. One embodiment disclosed performs monitored burn-in on sample wafers from a manufactured lot of wafers and determines a burn-in time for the lot from results of the monitored burn-in. The burn-in on remaining wafers from the lot is then performed for the burn-in time that was determined. Another embodiment disclosed performs burn-in on wafers from a manufactured lot of wafers while monitoring in real-time the burn-in for a subset of wafers in the lot. Using fallout data from the real-time monitoring, a determination is made as to whether the burn-in time is sufficient. If the burn-in time is determined to be sufficient, then the burn-in of the lot is stopped.

20 Claims, 7 Drawing Sheets

FIG. 2        200

LOT-OPTIMIZED WAFER LEVEL BURN-IN

BACKGROUND OF THE INVENTION

1. Field of the Invention

The present invention relates generally to integrated circuits (ICs), and more particularly to the manufacture and reliability of integrated circuits.

2. Description of the Background Art

Semiconductor manufacturers who make integrated circuit chips begin by fabricating semiconductor wafers. Each wafer is typically 100 mm, 125 mm, 150 mm, 200 mm or 300 mm in diameter and contains anywhere from one to several thousand chips or dice on the wafer. In the future, wafer sizes for semiconductor manufacturing are expected to continue to increase. When manufacture of the wafer is completed, chips or dice are cut or "diced" from the wafer and may later be mounted into single chip or multiple chip packages for implementation in a printed circuit board or other applications.

Reliability testing is used to screen out chips having an undesirable short life span. Typically, a significant percentage of a group of chips will fail early in their lifetime due to marginal conditions during manufacture. Subsequently, a very low percentage of the group will fail during an extended period of use of the chips. Reliability screening of semiconductor chips is typically performed by a process of supplying test signal patterns to chips under test to repeatedly stimulate substantially all devices and wires on a chip, and is typically performed at elevated temperatures to simulate or expedite the effects of the first months of operation. Therefore, the screening procedure is known as burn-in.

While very valuable, the process of burn-in has historically been time consuming and expensive for semiconductor manufacturers. Burn-in testing is typically conducted at temperatures in excess of 100 degrees Celsius and for prolonged periods of time (for example, 40 to 80 hours) with the chip running at relatively high operating voltages. Obviously, this slow rate of reliability testing impedes volume production of functional semiconductors and adds tremendous cost.

Many manufacturers have attempted to address low throughput of known burn-in processes by creating burn-in boards onto which many diced chips are placed in chip packages, and then the packages go into sockets on the burn-in boards. Thereafter, each chip on the test board is simultaneously exercised with test patterns at elevated temperatures. Thus, many chips are burned-in at once. These systems effectively reduce the time required to burn-in a large volume of chips. However, the added cost of packaging defective or unreliable die is a significant shortcoming of such known burn-in processes.

Another technique performs burn-in on the diced chips prior to packaging. Bare die burn-in (BDBI) is used to provide Known Good Die (KGD) determinations for multichip module's (MCM's) and other bare die applications, such as, chip-on-board (COB). Without bare die burn-in, yield of MCM's (and other bare die applications) is severely impaired, resulting in higher product costs. A bare die is typically placed into a temporary package, and the burn-in test is performed. The required alignment and handling steps in this procedure add cost, process complexity, and time to provide bare dies that will be reliable or "Known Good."

Another technique is to perform burn-in on whole or parts of whole wafers containing undiced integrated circuits or chips. This process is known as wafer level burn-in (WLBI). In wafer level burn-in, electrical terminals from a test apparatus are brought into intimate contact with contact pads of one or more chips. It is therefore less destructive and costly than soldering chips to a burn-in board.

While progress has been made in burn-in processes, further improvement is desired to improve throughput of these processes.

SUMMARY

The invention relates to wafer level burn-in of integrated circuits on a semiconductor wafer. One embodiment of the invention performs monitored burn-in on sample wafers from a manufactured lot of wafers and determines a burn-in time for the lot from results of the monitored burn-in. The burn-in on remaining wafers from the lot is then performed for the burn-in time that was determined.

Another embodiment of the invention performs burn-in on wafers from a manufactured lot of wafers while monitoring in real-time the burn-in for a subset of wafers in the lot. Using fallout data from the real-time monitoring, a determination is made as to whether the burn-in time is sufficient. If the burn-in time is determined to be sufficient, then the burn-in of the lot is stopped.

These and other features of the present invention will be readily apparent to persons of ordinary skill in the art upon reading the entirety of this disclosure, which includes the accompanying drawings and claims.

BRIEF DESCRIPTION OF THE DRAWINGS

FIG. 1 is a flow chart depicting a conventional method for wafer level burn-in.

DETAILED DESCRIPTION

In the present disclosure, numerous specific details are provided, such as examples of apparatus, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
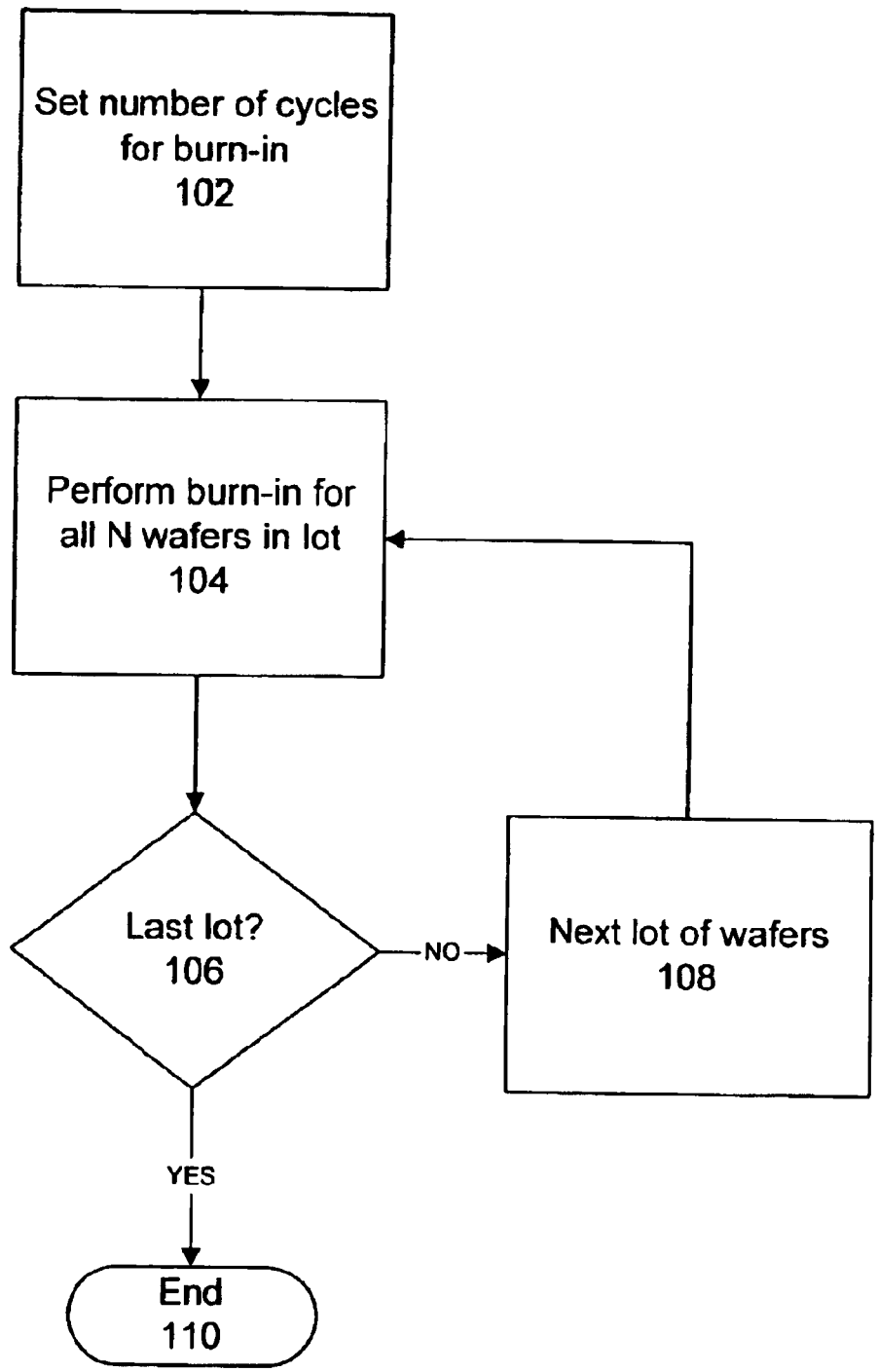

FIG. 1 is a flow chart depicting a conventional method 100 for wafer level burn-in. Wafer level burn-in stresses the integrated circuits on the wafer to force defective ICs to fail at an early stage before they are assembled and sent to the work field. The conventional method 100 is depicted using five blocks (102, 104, 106, 108, and 110).

In the first block 102, a number of cycles to perform burn-in is set. In the second block 104, burn-in is performed for all N wafers in a manufactured lot. In the third block 106, a determination is made if the last lot of wafers has been burned-in. If the last lot has been burned-in, then the method 100 ends in the fifth block 110. Otherwise, the method 100 proceeds to the fourth block 108 for obtaining the next lot of wafers for burning-in. The burning-in of the next lot is accomplished by looping back to the second block 104.

Figure 2:
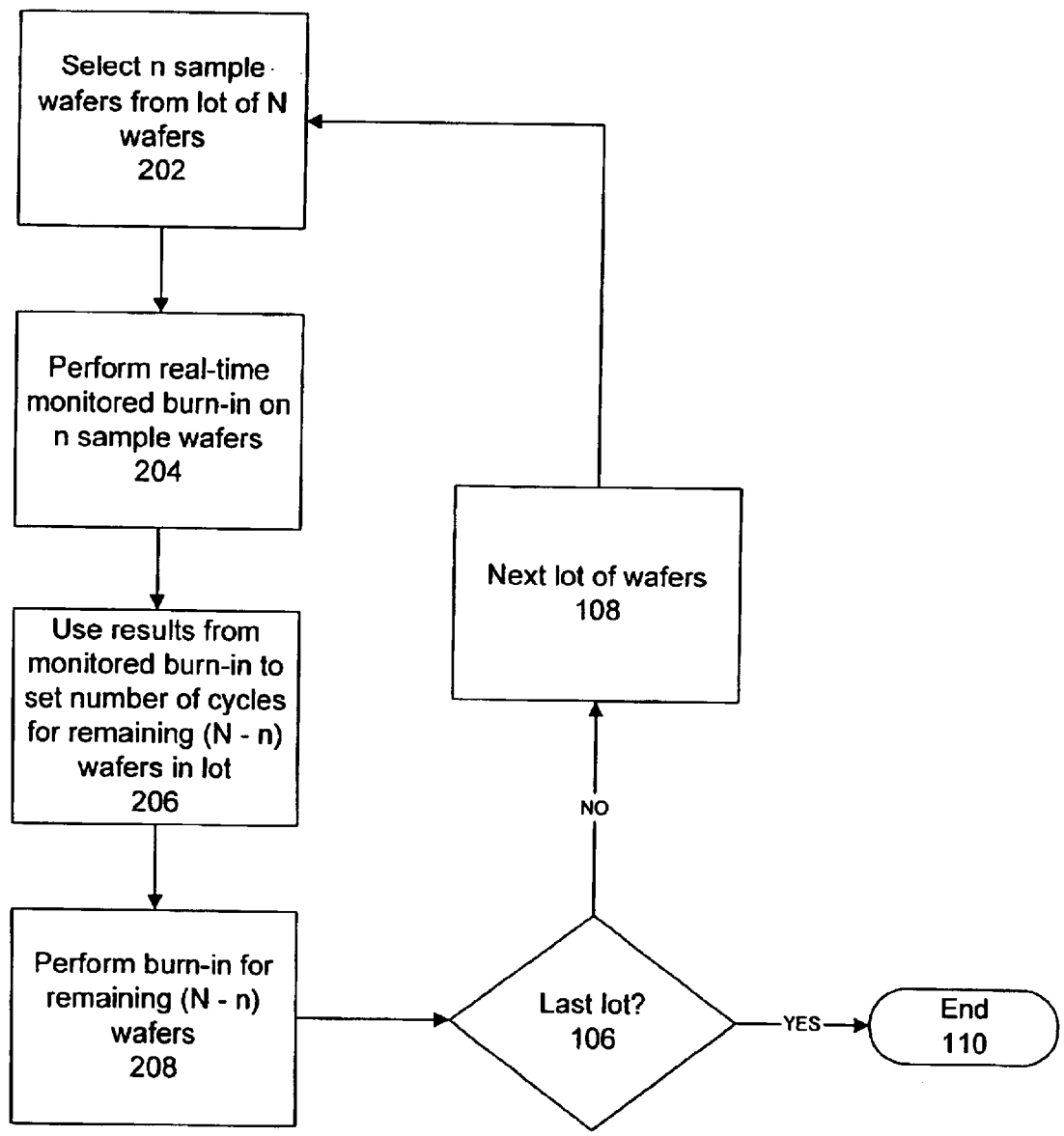
FIG. 2 is a flow chart depicting a first method for lot-optimized wafer level burn-in in accordance with an embodiment of the invention.

FIG. 2 is a flow chart depicting a first method 200 for lot-optimized wafer level burn-in in accordance with an embodiment of the invention. The method 200 as depicted includes seven blocks (202, 204, 206, 208, 106, 108, and 110).

The first four blocks (202, 204, 206, and 208) comprise new steps over the conventional method 100. In the first block 202, one or more sample wafers are selected from a manufactured lot of N wafers. The number of sample wafers may be denoted by n. For example, the number n may be equal to three. The number n should be large enough such that there are sufficient chips on the n wafers to give meaningful statistics during the monitored burn-in 204.

In the second block 204, real-time monitored burn-in is performed on the n sample wafers. In this step 204, the burn-in is monitored in real-time by testing the integrated circuits on the wafers during the burn-in process. The testing determines the failure rate of the ICs as the burn-in proceeds. In one embodiment, the testing is performed in real-time using built-in self test (BIST) circuitry on the chips. BIST circuitry is additional circuitry on a chip that may be used to test for the proper operation of primary circuitry on the chip. The method for performing this real-time monitored burn-in 204 is described further below in relation to FIG. 3.

In the third block 206, the results from the monitored burn-in are used to set the number of cycles for burning-in the remaining wafers of the lot. If N is the number of wafers in the lot, then (N−n) is the number of remaining wafers. In the fourth block 208, the burn-in is performed on the remaining (N−n) wafers. The burn-in for the remaining wafers may be unmonitored.

The fifth 106, sixth 108, and seventh 110 blocks of FIG. 2 are analogous to the third 106, fourth 108, and fifth 110 blocks of FIG. 1, respectively. In the fifth block 106 of FIG. 2, a determination is made if the last lot of wafers has been burned-in. If the last lot has been burned-in, then the method 200 ends in the seventh block 110. Otherwise, the method 200 proceeds to the sixth block 108 for obtaining the next lot of wafers for burning-in. The burning-in of the next lot is accomplished by looping back to the first block 202.

Advantageously, the method 200 of FIG. 2 dynamically sets the burn-in time per manufactured lot of wafers to an optimal level. This reduces the time needed to burn-in the lot of wafers. Although the monitored burn-in 204 of the sample wafers also takes time, the sample burn-in 204 for one lot may be performed in parallel with the burn-in of remaining wafers 208 for a different lot. Such a pipeline process 600 is described further below in relation to FIG. 6.

Figure 3:
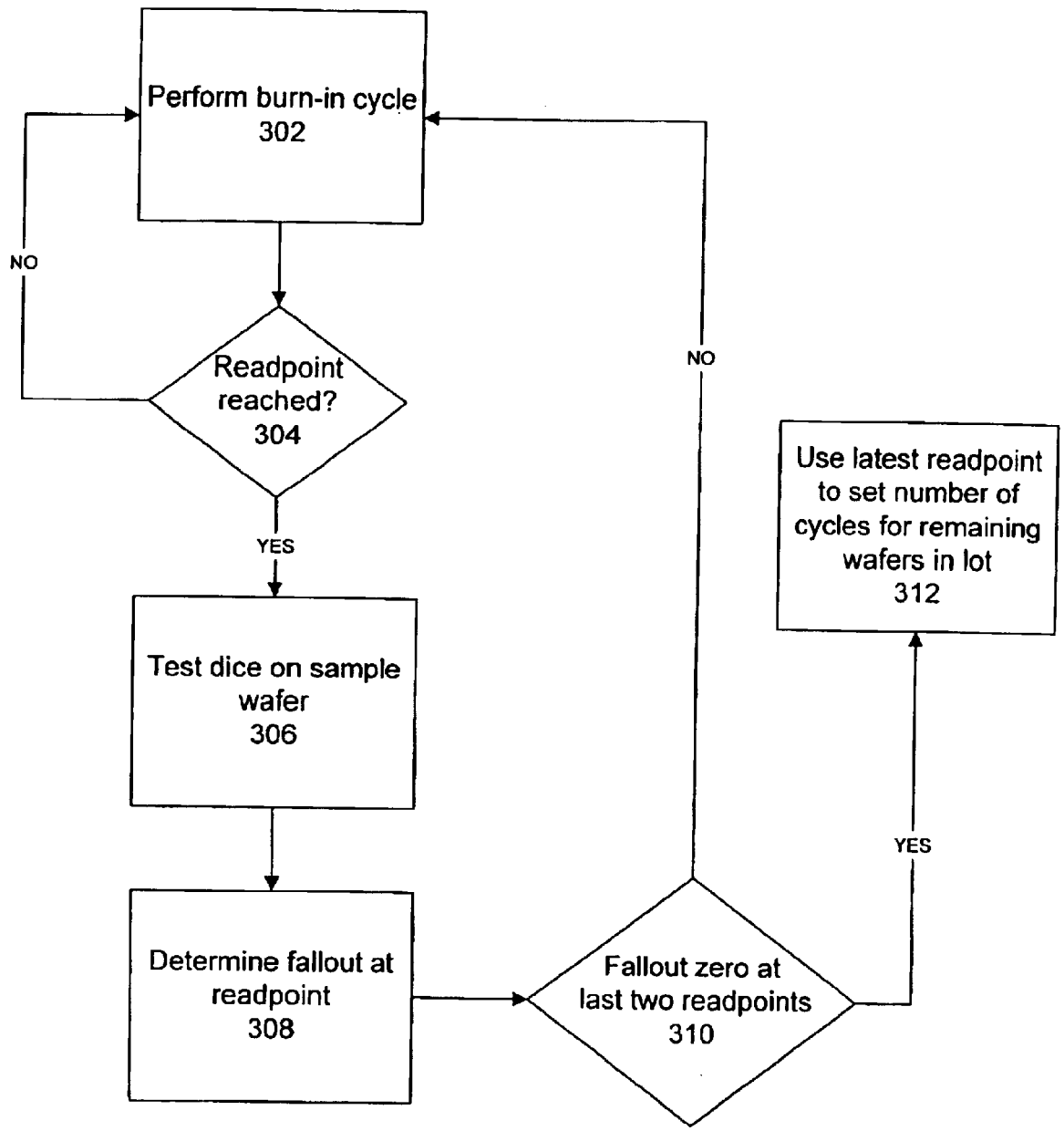
FIG. 3 is a flow chart depicting a method for performing real-time monitored wafer level burn-in on sample wafers in accordance with an embodiment of the invention.

FIG. 3 is a flow chart depicting a method 204 for performing real-time monitored wafer level burn-in on sample wafers in accordance with an embodiment of the invention. The method 204 as depicted includes six blocks (302, 304, 306, 308, 310, and 312).

In the first block 302, a burn-in cycle is performed on the sample wafers. Per the second block 304, the first block 302 repeats (performing burn-in cycles) until a readpoint is reached. Readpoints are predesignated numbers of cycles at which the testing is to be performed. Once a readpoint is reached, the method 204 goes on to the third block 306.

In the third block 306, the integrated circuits (i.e. the individual dice) on the sample wafer(s) are tested. As mentioned above, in one embodiment, this testing is performed in real-time using BIST circuitry that is designed into the ICs. The BIST circuitry may include a BIST controller, a pattern generator, and a signature analyzer. The primary circuitry of an IC may be tested by commanding the BIST controller to initiate a self test. In the fourth block 308, the fallout at the readpoint is determined. The fallout may be defined as the number of ICs that have failed since the previous readpoint. In other words, the fallout measures the number of new device failures.

In the fifth block 310, the fallout data is analyzed to determine if the burn-in time is sufficient. In the particular embodiment depicted in FIG. 5, a determination is made as to whether the fallout is zero at the last two readpoints. If the fallout is zero at the last two readpoints, then the burn-in time is deemed to be sufficient and so, in the sixth block 312, the latest readpoint is used to set the number of burn-in cycles for the remaining wafers in that lot. Otherwise, the method 300 continues by looping back to the first block 302. In other embodiments, other criteria may be used to determine if the burn-in time is sufficient.

Figure 4:
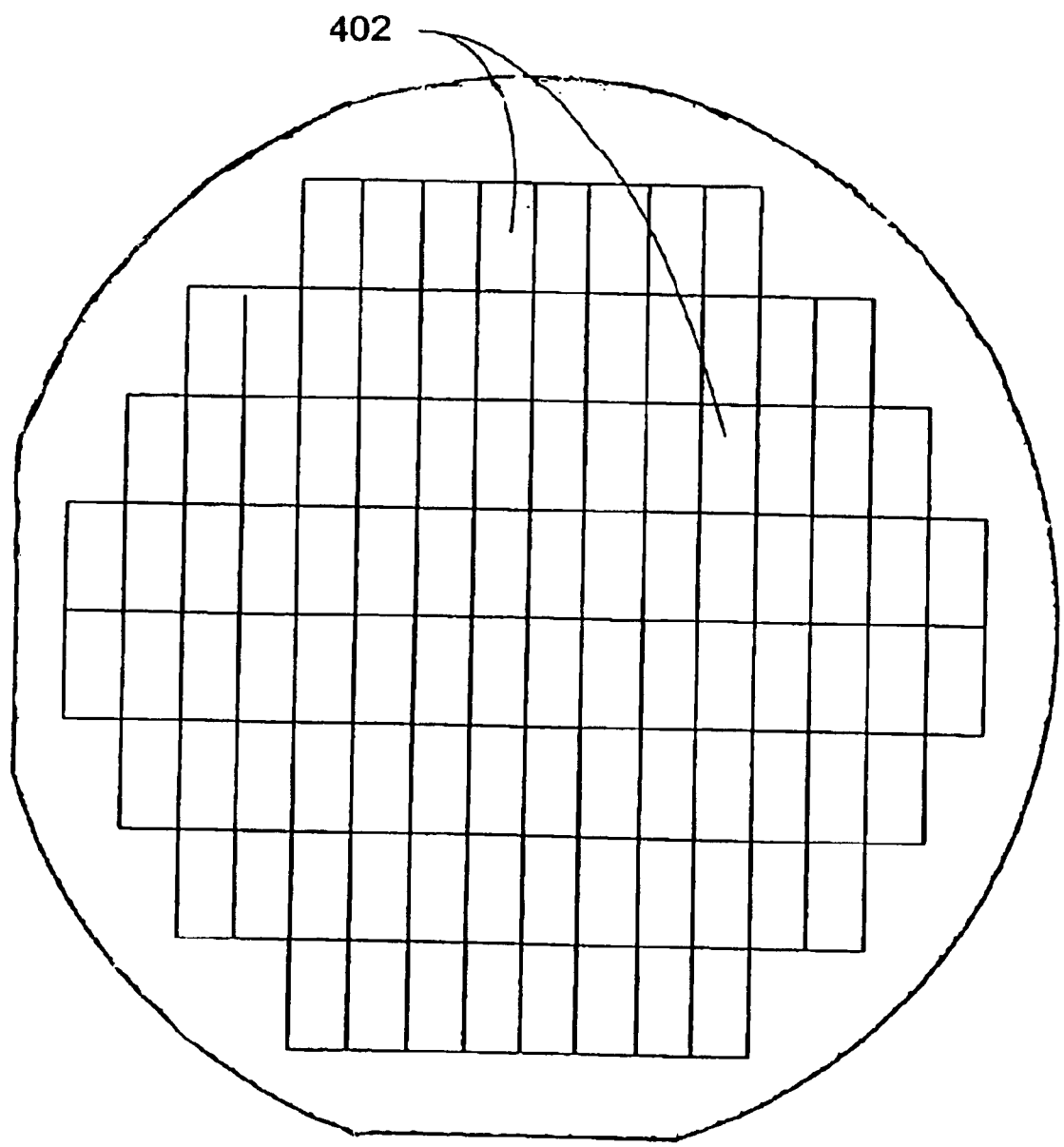
FIG. 4 is an illustration depicting a semiconductor wafer.

FIG. 4 is an illustration depicting a typical semiconductor wafer. As shown, the wafer includes a plurality of IC dice 402 that are eventually separated from each other. In one embodiment of the invention, BIST circuitry is incorporated into each IC die 402.

Figure 5:
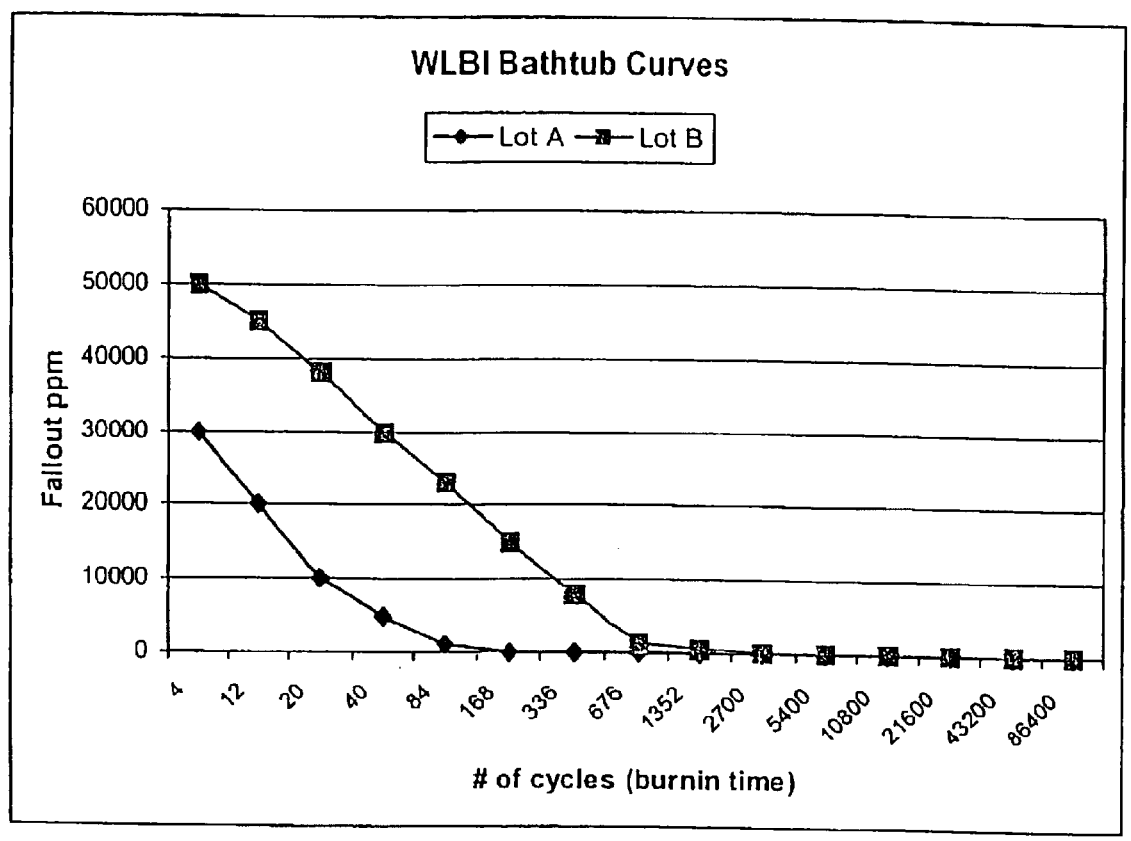
FIG. 5 is a graph depicting wafer level burn-in bathtub curves for optimization per lot in accordance with an embodiment of the invention.

FIG. 5 is a graph depicting wafer level burn-in bathtub curves for optimization per lot in accordance with an embodiment of the invention. The graph shows the fallout in parts per million (ppm) versus the number of cycles (i.e. the burn-in time). As depicted, the fallout for manufactured Lot A drops more quickly than the fallout for manufactured Lot B. The fallout data are shown for a plurality of readpoints. The readpoints in FIG. 5 are at 4 cycles, 12 cycles, 20 cycles, 40 cycles, 84 cycles, and so on. Using the criterion that the fallout be at zero for two consecutive readpoints, the sufficient burn-in time determined to be 336 cycles for Lot A and 2700 cycles for Lot B. This illustrates how the requisite burn-in time may vary depending on the particular manufactured lot of wafers. In this example, the requisite burn-in time for Lot A is about eight times less than the requisite burn-in time for Lot B. Hence, much time may be saved using the present invention that optimizes burn-in time per lot instead of using a single burn-in time for all lots.

Figure 6:
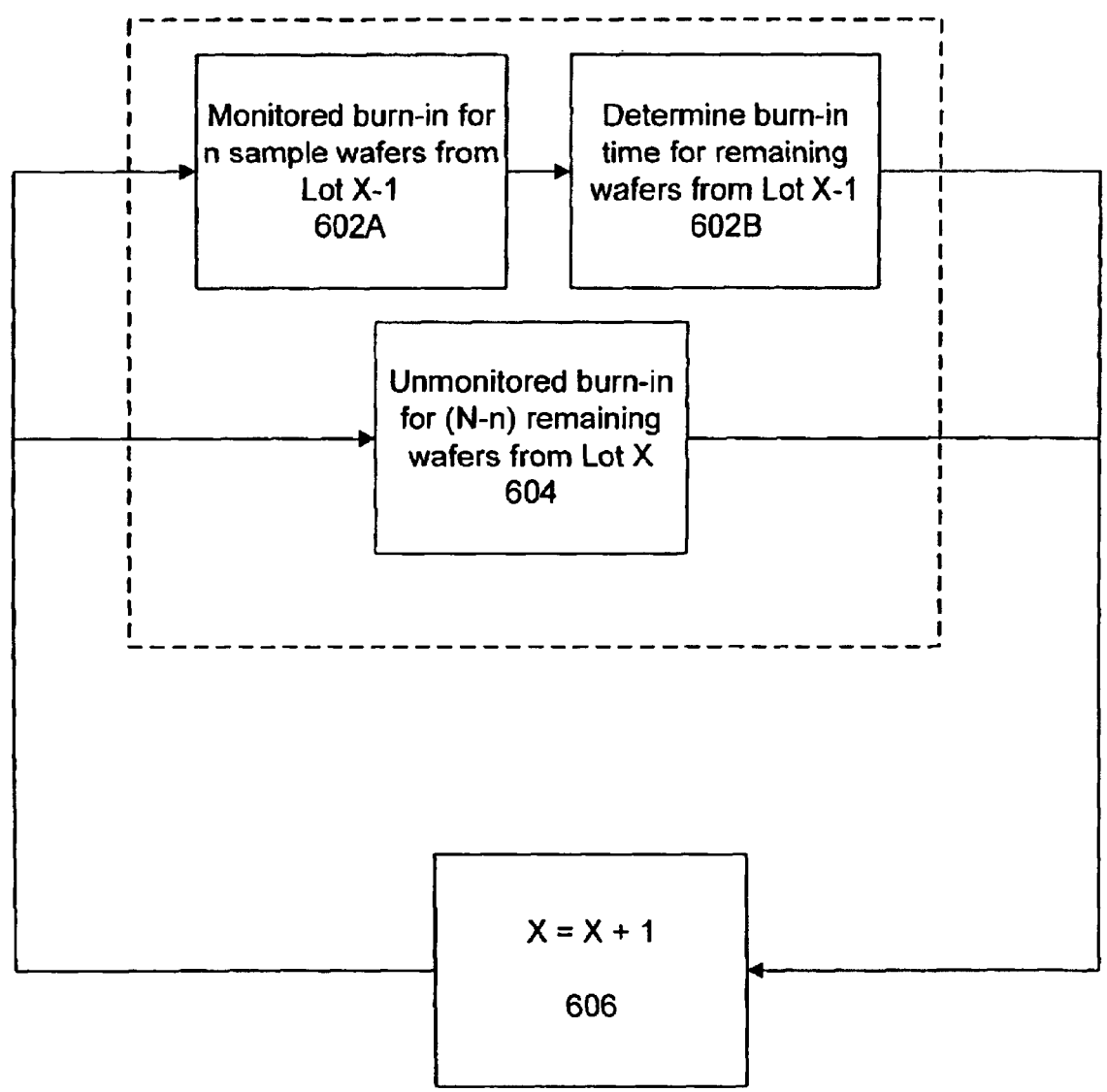
FIG. 6 is a diagram depicting a pipeline type process for lot-optimized wafer level burn-in in accordance with an embodiment of the invention.

FIG. 6 is a diagram depicting a pipeline type process 600 for lot-optimized wafer level burn-in in accordance with an embodiment of the invention. The process 600 illustrates how the sample burn-in 204 for one lot may be performed in parallel with the burn-in of remaining wafers 208 for a different lot. The process 600 as depicted includes four blocks (602A, 602B, 604, and 606).

The first two blocks 602A and 602B relate to the sample burn-in for one lot while the third block 604 relates to the burn-in of remaining wafers 208 for a different lot. In the particular example depicted, the sample burn-in is performed on "Lot X−1" while the burn-in of remaining wafers is performed on "Lot X."

In the first block 602A, a monitored burn-in is performed for n sample wafers from Lot X−1. From the results of the monitored burn-in, a determination is made of the requisite burn-in time for remaining wafers from that lot (Lot X−1). Meanwhile, in the third block 604, an unmonitored burn-in is performed for (N−n) remaining wafers from a different lot (Lot X). Per the fourth block 606, the pipeline process may be move forward by incrementing X to be X+1. In other words, the first two blocks (602A and 602B) may comprise a first stage of the pipeline process 600, and the second block 604 may comprise a second stage of the pipeline process 600. This pipeline process 600 may be used to efficiently burn-in a plurality of manufactured lots.

Figure 7:
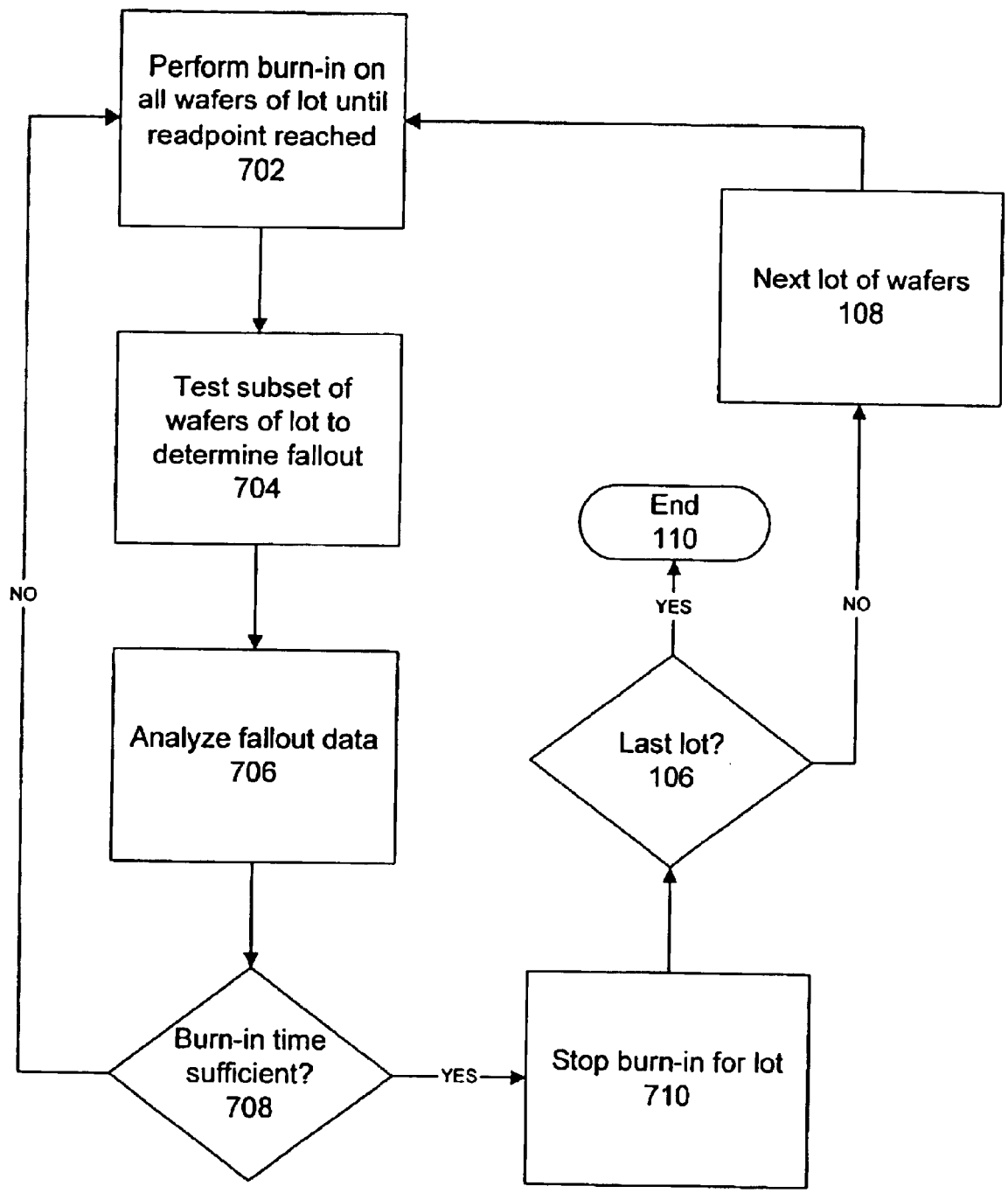
FIG. 7 is a flow chart depicting a second method for lot-optimized wafer level burn-in in accordance with an embodiment of the invention The use of the same reference label in different drawings indicates the same or like components. Drawings are not necessarily to scale unless otherwise noted.

FIG. 7 is a flow chart depicting a second method 700 for lot-optimized wafer level burn-in in accordance with an embodiment of the invention. The method 700 as depicted includes eight blocks (702, 704, 706, 708, 710, 106, 108, and 110).

The first five blocks (702, 704, 706, 708, and 710) comprise new steps over the conventional method 100. In the first block 702, burn-in is performed on all wafers of a manufactured lot until a readpoint is reached. In the second block 704, a subset of (monitored) wafers from the lot are tested to determine the fallout at the readpoint. The number of wafers in the subset should be selected to provide sufficiently meaningful fallout statistics.

In the third step 706, the fallout data from the testing is analyzed. In the fourth step 708, a determination is made as to whether the burn-in time (up until the readpoint) is sufficient. This determination is made by analysis of the fallout data. As described above, in one embodiment, the burn-in time may be deemed to be sufficient if the fallout is at zero for the last two readpoints. If the burn-in time is not deemed to be sufficient, then the method 700 loops back to the first block 702 and the burn-in continues. On the other hand, if the burn-in time is deemed to be sufficient, then in the fifth block 710 the burn-in for the lot is stopped.

The sixth 106, seventh 108, and eighth 110 blocks of FIG. 7 are analogous to the third 106, fourth 108, and fifth 110 blocks of FIG. 1, respectively. In the sixth block 106 of FIG. 7, a determination is made if the last lot of wafers has been burned-in. If the last lot has been burned-in, then the method 700 ends in the eighth block 110. Otherwise, the method 700 proceeds to the seventh block 108 for obtaining the next lot of wafers for burning-in. The burning-in of the next lot is accomplished by looping back to the first block 702.

Advantageously, the method 700 of FIG. 7 dynamically sets the burn-in time per manufactured lot of wafers to an optimal level. This reduces the time needed to burn-in the lot of wafers.

In accordance with embodiments of the invention, the burn-in of wafers at the wafer level may be done in a large oven that is wired through the oven wall. Contact with the wafers may be made through test probes through which power may be applied and signals applied and received. Analysis of the test data for the real-time monitoring may be performed by software code on a computer for the test system.

While specific embodiments of the present invention have been provided, it is to be understood that these embodiments are for illustration purposes and not limiting. Many additional embodiments will be apparent to persons of ordinary skill in the art. reading this disclosure. Thus, the present invention is limited only by the following claims.

What is claimed is:

1. A method of burning-in multiple semiconductor wafers from a single manufactured lot, the method comprising:
performing monitored burn-in on multiple dies of at least one sample wafer from the manufactured lot of wafers;
determining a sufficient burn-in time for remaining wafers of the lot during the monitored burn-in of the sample wafer(s); and
performing burn-in on remaining wafers from the lot for the sufficient burn-in time that was determined.

2. The method of claim 1, wherein the monitored burn-in is performed on multiple dies of a plurality of sample wafers from the lot.

3. The method of claim 1, wherein the monitored burn-in is monitored in real-time using built-in self test circuitry.

4. The method of claim 1, wherein the monitored burn-in comprises:
performing burn-in cycles until a readpoint is reached;
testing dies on the sample wafer(s); and
determining fallout at the readpoint,
wherein the fallout comprises a number of the testing dies on the sample wafer(s) that have failed since a previous readpoint.

5. The method of claim 4, wherein the monitored burn-in further comprises:
repeating the performing, testing and determining for a plurality of readpoints.

6. The method of claim 5, wherein determining the burn-in time for the wafer lot comprises:
determining if the burn-in time is sufficient by analyzing the fallout data; and
using a number of cycles of the latest readpoint to set the burn-in time for the lot if the burn-out time is determined to be sufficient.

7. The method of claim 6, wherein determining if the burn-in time is sufficient comprises determining if the fallout at two last readpoints is no higher than a threshold value.

8. The method of claim 7, wherein the threshold value is zero.

9. The method of claim 1, wherein the monitored burn-in is performed on sample wafer(s) of one manufactured lot while the burn-in is performed on remaining wafers of another manufactured lot.

10. The method of claim 9, wherein the method comprises a pipeline process for burning-in manufactured lots of wafers.

11. The method of claim 1, wherein the burn-in time varies depending on the manufactured lot.

12. A method of burning-in multiple semiconductor wafers from a single manufactured lot of wafers, the method comprising:
performing burn-in on the multiple wafers from the manufactured lot of wafers;
real-time monitoring of the burn-in for a subset of the multiple wafers;
dynamically determining, during the burn-in of the multiple wafers, if burn-in time is deemed to be sufficient by analyzing fallout data from the real-time monitoring of the subset of the multiple wafers; and
stopping the burn-in of the multiple wafers when the burn-in time is deemed to be sufficient.

13. The method of claim 12, wherein the real-time monitoring is accomplished using built-in self test circuitry on dies of the wafers.

14. The method of claim 12, wherein the real-time monitoring comprises:
testing dies on the sample wafers at readpoints during the burn-in; and
measuring fallout at each readpoint.

15. The method of claim 12, wherein determining if burn-in time is deemed to be sufficient comprises determining if fallout at two last readpoints are below a threshold.

16. The method of claim 12, wherein the burn-in time varies depending on the manufactured lot.

17. A system for burn-in multiple semiconductor wafers from a single manufactured lot, the system comprising:
- means for performing monitored burn-in on multiple dies of at least one sample wafer from the manufactured lot of wafers;
- means for determining a sufficient burn-in time for remaining wafers of the lot during the monitored burn-in of the sample wafer(s);
- means for performing burn-in on remaining wafers from the lot for the sufficient burn-in time that was determined.

18. The system of claim 17, wherein the monitored burn-in is performed on a plurality of sample wafers from the lot.

19. The system of claim 17, wherein the monitored burn-in is monitored in real-time using built-in self test circuitry.

20. A system of burning-in multiple semiconductor wafers from a single manufactured lot of wafers, the system comprising:
- means for performing burn-in on the multiple wafers from the manufactured lot of wafers;
- means for real-time monitoring of the burn-in for a subset of the multiple wafers;
- means for dynamically determining during the burn-in of the multiple wafers if burn-in time is deemed to be sufficient by analyzing fallout data from the real-time monitoring of the subset of the multiple wafers; and
- means for stopping the burn-in of the multiple wafers when the burn-in time is deemed to be sufficient.

* * * * *